US009591791B1

(12) United States Patent
Cossale et al.

(10) Patent No.: US 9,591,791 B1
(45) Date of Patent: Mar. 7, 2017

(54) SYSTEM AND METHOD FOR COOLING AND DELIVERING POWER TO A COMPUTER SYSTEM

(71) Applicant: International Business Machines Corporation, Armonk, NY (US)

(72) Inventors: Matteo Cossale, Rueschlikon (CH); Bruno Michel, Zurich (CH); Stephan Paredes, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 5 days.

(21) Appl. No.: 14/983,824

(22) Filed: Dec. 30, 2015

(51) Int. Cl.
*H05K 7/20* (2006.01)
(52) U.S. Cl.
CPC ..... *H05K 7/20772* (2013.01); *H05K 7/20254* (2013.01); *H05K 7/20781* (2013.01)
(58) Field of Classification Search
None
See application file for complete search history.

(56) References Cited

U.S. PATENT DOCUMENTS

| 4,164,362 | A | * | 8/1979 | Cobaugh | H01R 13/514 |
| | | | | | 361/802 |
| 5,030,108 | A | * | 7/1991 | Babow | C07C 45/70 |
| | | | | | 174/72 B |
| 5,751,558 | A | * | 5/1998 | Gullicksrud | H05K 7/1455 |
| | | | | | 211/41.17 |
| 5,825,621 | A | * | 10/1998 | Giannatto | H05K 7/202 |
| | | | | | 165/104.33 |
| 5,835,349 | A | * | 11/1998 | Giannatto | H05K 7/202 |
| | | | | | 165/104.33 |
| 8,027,162 | B2 | * | 9/2011 | Campbell | H05K 7/2079 |
| | | | | | 165/104.33 |
| 8,879,257 | B2 | | 11/2014 | Campbell et al. | |
| 2004/0057211 | A1 | * | 3/2004 | Kondo | G06F 1/20 |
| | | | | | 361/696 |
| 2007/0109150 | A1 | * | 5/2007 | Gershfeld | H05K 7/1455 |
| | | | | | 341/22 |
| 2008/0007913 | A1 | * | 1/2008 | Sullivan | H05K 7/20636 |
| | | | | | 361/699 |
| 2008/0024992 | A1 | * | 1/2008 | Pflueger | H05K 7/20 |
| | | | | | 361/705 |
| 2010/0039773 | A1 | * | 2/2010 | Tilton | H01L 23/427 |
| | | | | | 361/699 |

(Continued)

*Primary Examiner* — Courtney Smith
*Assistant Examiner* — Zhengfu Feng
(74) *Attorney, Agent, or Firm* — Cantor Colburn LLP; David Quinn

(57) ABSTRACT

A cooling and power delivery system for a computer system includes a first fluid, a second fluid conduit, and a power supply thermally connected to at least one of the first and second fluid conduits. A first board receiving member is fluidically connected to the first and second fluid conduits and electrically connected to the power supply. A second board receiving member is fluidically connected to the first and second fluid conduits and electrically connected to the power supply. An electronics board is supported between the first board receiving member and the second board receiving member. The electronics board is electrically connected to the power supply through at least one of the first and second board receiving members.

19 Claims, 6 Drawing Sheets

(56) References Cited

U.S. PATENT DOCUMENTS

| | | | |
|---|---|---|---|
| 2011/0058335 A1* | 3/2011 | Sullivan | H05K 7/1404 361/704 |
| 2011/0267776 A1* | 11/2011 | Porreca | H05K 7/20545 361/694 |
| 2013/0027870 A1* | 1/2013 | Goldr an | H01L 23/473 361/679.32 |
| 2013/0120926 A1* | 5/2013 | Barina | H01L 23/4093 361/679.32 |
| 2013/0135812 A1* | 5/2013 | Barina | H01L 23/427 361/679.32 |
| 2014/0240930 A1* | 8/2014 | Arvelo | H05K 7/2039 361/721 |
| 2014/0307384 A1 | 10/2014 | Best | |
| 2015/0160702 A1* | 6/2015 | Franz | H05K 7/20772 361/679.47 |
| 2015/0222099 A1 | 8/2015 | Sliech et al. | |

* cited by examiner

SYSTEM AND METHOD FOR COOLING AND DELIVERING POWER TO A COMPUTER SYSTEM

BACKGROUND

The present invention relates to the art of computer systems and, more particularly, to a system and method of cooling and delivering power to a computer system.

High density computer systems are ubiquitous in modern cloud data centers. Servers crowded with various electronic boards may be found in most offices both large and small. The electronic boards and associated power supplies generate heat during operation. Accordingly, servers are typically arranged in special rooms that are designed with numerous environmental control considerations. Environmental controls may range from climate control units, ventilation, raised flooring to enhance air circulation, and/or water cooling. Removing heat from servers and other high density computer systems with high performance cooling equipment enhances performance and reduces maintenance requirements.

SUMMARY

According to an aspect of an exemplary embodiment, a cooling and power delivery system for a computer system including a first fluid conduit, a second fluid conduit, and a power supply thermally connected to at least one of the first and second fluid conduits. A first board receiving member is fluidically connected to the first and second fluid conduits and electrically connected to the power supply. The first board receiving member includes a first plurality of board receiving slots. A second board receiving member is fluidically connected to the first and second fluid conduits and electrically connected to the power supply. The second board receiving member includes a second plurality of board receiving slots. An electronics board is supported between one of the first plurality of board receiving slots and one of the second plurality of board receiving slots. The electronics board being electrically connected to the power supply through at least one of the first and second board receiving members.

According to another aspect of an exemplary embodiment, a method of cooling and delivering power to a computer system includes guiding a fluid into a fluid conduit, passing heat from a power supply thermally connected to the fluid conduit into the fluid, delivering the fluid into a first board receiving member, guiding the fluid into a second board receiving member, and delivering power to the electronic card from the power supply through at least one of the first and second board receiving members.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
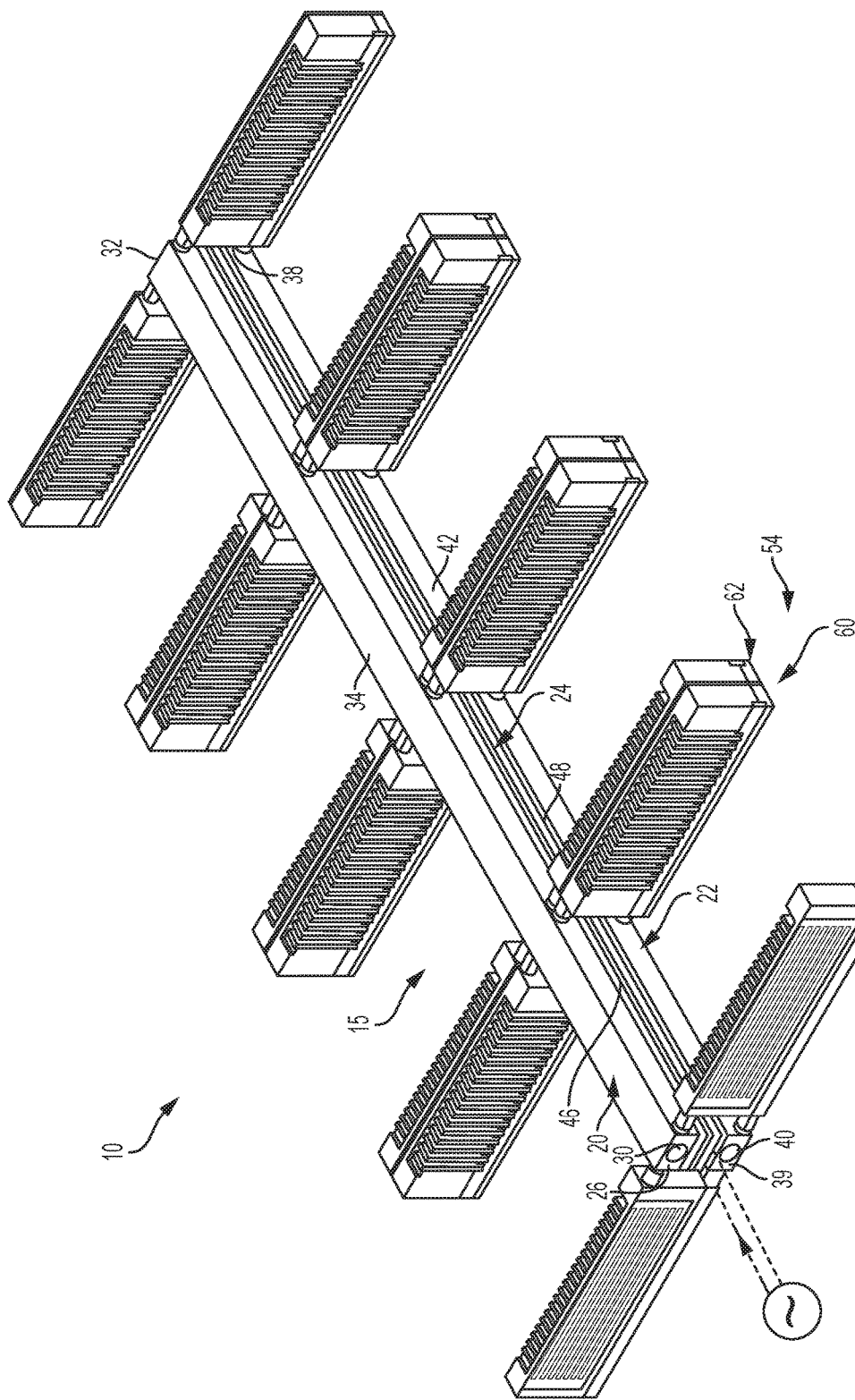
FIG. 1 depicts a cooling and power delivery system for a computer system, in accordance with an exemplary embodiment.
Figure 2:
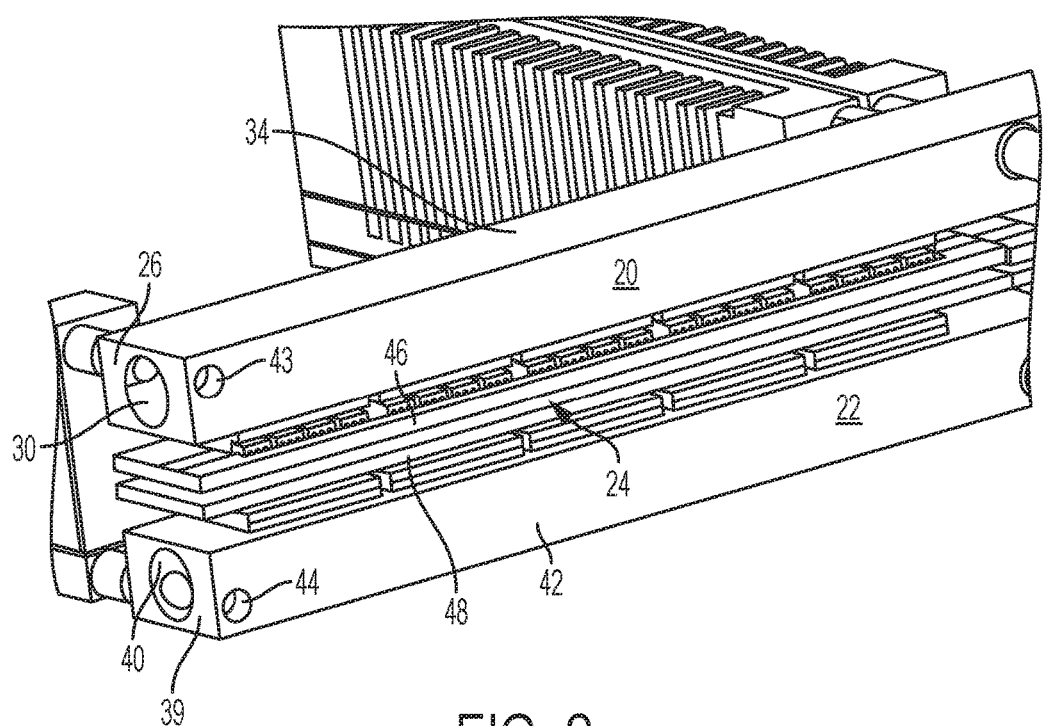
FIG. 2 depicts a portion of a backbone manifold of the cooling and power delivery system of FIG. 1.

With reference now to FIG. 1, a cooling and power delivery system, in accordance with an exemplary embodiment, is indicated generally at 10. Cooling and power delivery system 10 includes a backbone manifold 15 including a first fluid conduit 20, a second fluid conduit 22 and a power supply assembly 24. First fluid conduit 20 includes a first end 26 that defines n inlet portion 30, a second end 32 and an intermediate portion 34 extending therebetween. Second fluid conduit 22 includes an first end 38, a second end 39 that defines an outlet section 40, and an intermediate section 42 extending therebetween. In the exemplary embodiment shown, inlet portion 30 is fluidically connected to a source of a fluid coolant (not shown). Further, as shown in FIG. 2, intermediate portion 34 includes a number of outlet openings, one of which is shown at 43 and intermediate section 42 includes a number of inlet openings, one of which is shown at 44. As will be discussed more fully below, outlet openings 43 and inlet openings 44 facilitate an exchange of coolant between first fluid conduit 20 and second fluid conduit 22.

As shown in FIG. 2, power supply assembly 24 is arranged between and in a heat exchange relationship with first and second fluid conduits 20 and 22. More specifically, fluid flowing through first and second conduits 20 and 22 absorbs heat from power supply assembly 24. In accordance with an aspect of an exemplary embodiment, the fluid flowing through first and second fluid conduits 20 and 22 is a liquid. The liquid may take on many forms including water, glycol based products and the like that are receptive to heat exchange. Of course, it should be understood, that the fluid may also comprise a gas and/or mixtures of fluid and gas.

In the exemplary embodiment shown, power supply assembly 24 includes one or more first power supply units 46 thermally connected with first fluid conduit 20 and one or more second power supply units 48 thermally connected with second fluid conduit 22. Power supply units 46 and 48 may convert alternating current (AC) line voltage into a direct current (DC) power for a computer system.

Figure 3:
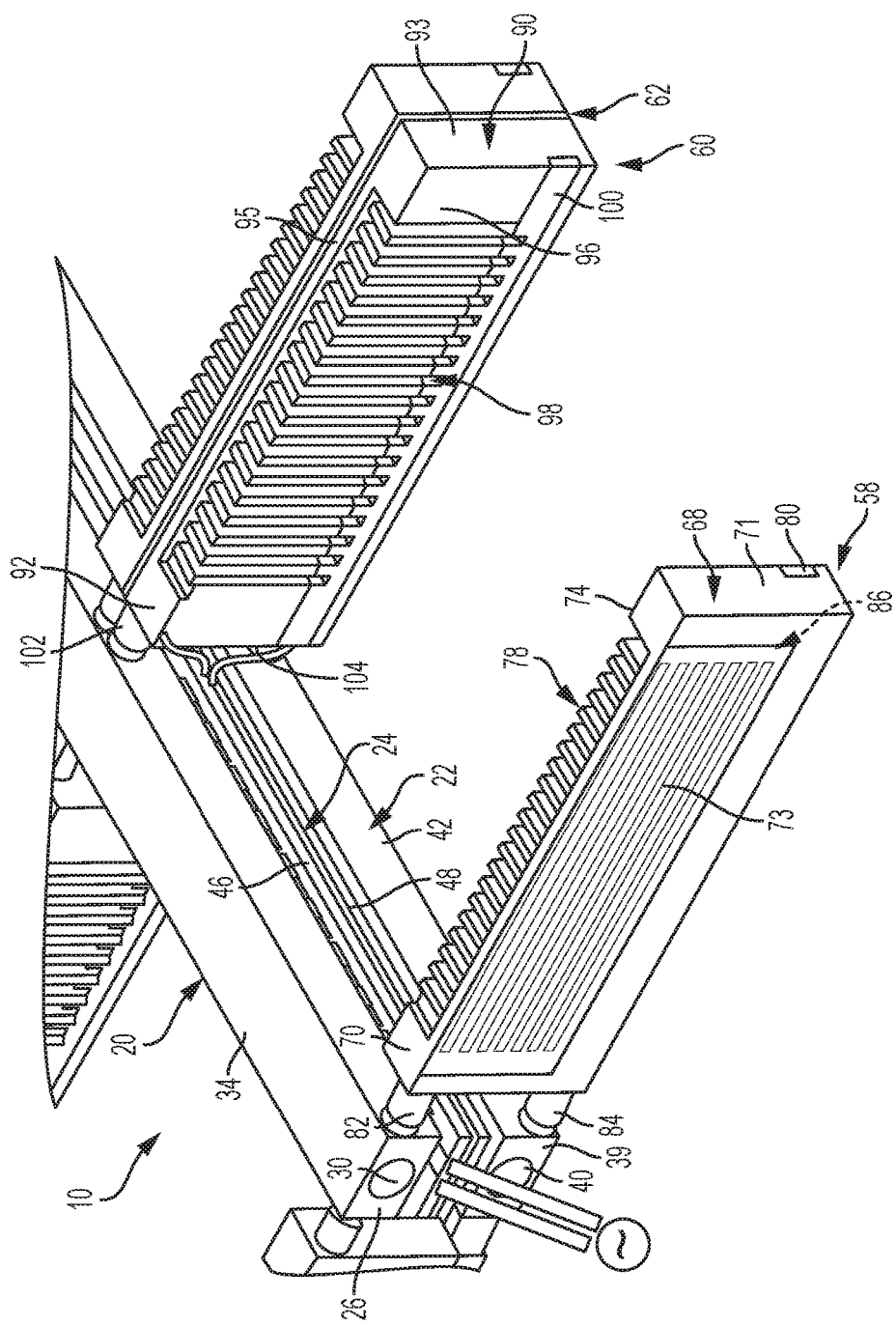
FIG. 3 depicts first and second board receiving members of the cooling and power delivery system of FIG. 1.

In accordance with an aspect of an exemplary embodiment, cooling and power delivery system 10 includes a plurality of board receiving members 54. As will be detailed more fully below, board receiving members 54 support, provide power to, and cooling for, one or more computer boards. Plurality of board receiving member 54 include at least a first board receiving member 58 and a second board receiving member 60. As shown in FIG. 3, second board receiving member 60 forms part of a board receiving member pair 62.

First board receiving member 58 includes a first body 68 having a first end 70 and a second end 71. A first side 73 extends between first end 70 and second end 71. Similarly, a second, opposing side 74 extends between first end 70 and second end 71. A plurality of board receiving slots 78 are provided on second side 74. A power rail 80 extends between first end 70 and second end 71 adjacent to the plurality of board receiving slots 78. Power rail 80 conducts power from power supply assembly 24 to first board receiving member 58. Further, a portion of first body 68 is grounded. Additionally, first board receiving member 58 includes a fluid inlet 82, a fluid outlet 84 and a cooling fluid circuit 86 extending therebetween. Fluid inlet 82 is fluidically connected to first fluid conduit 20 through one of outlet openings 43, while fluid outlet 84 is fluidically connected to second fluid conduit 22 through one of inlet openings 44.

Similarly, second board receiving member 60 includes a second body 90 having a first end 92 and a second end 93. A first side 95 extends between first and second ends 92 and 93. A second, opposing side 96 also extends between first and second ends 92 and 93. A plurality of board receiving slots 98 are arranged in second side 96. A power rail 100 extends between first and second end 92 and 93 adjacent to the plurality of board receiving slots 98. In a manner similar to that described above, a portion of second body 90 is grounded. Additionally, second board receiving member 60 includes a fluid inlet 102, a fluid outlet 104 and a cooling fluid circuit (not shown) extending therebetween. Fluid inlet 102 is fluidically connected to first fluid conduit 20 while fluid outlet 104 is fluidically connected to second fluid conduit 22.

Figure 4:
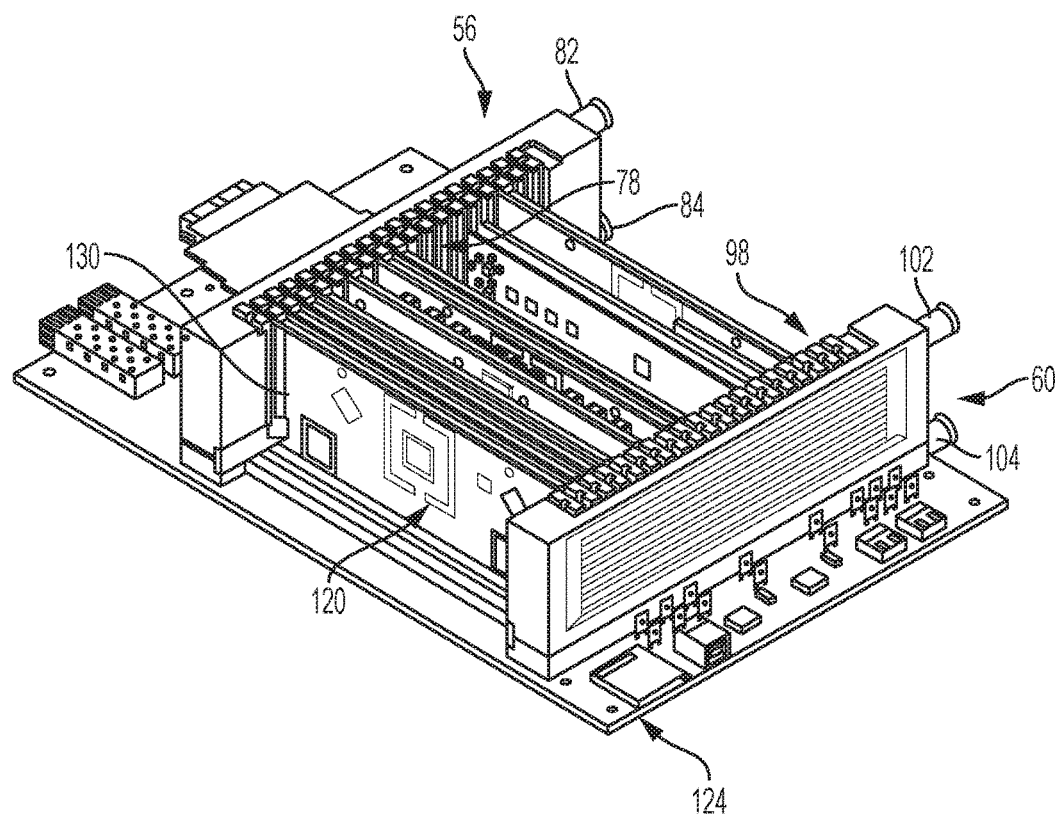
FIG. 4 depicts electronics boards supported by the cooling and power delivery system of FIG. 1.

In accordance with an aspect of an exemplary embodiment, cooling and power delivery system 10 includes a plurality of electronic board assemblies indicated generally at 120 in FIG. 4. In the exemplary embodiment shown, electronic board assemblies 120 are supported between first and second board receiving members 58 and 60 and connected to a main carrier board 124.

In further accordance with an aspect of an exemplary embodiment, each electronic board 120 includes a heat spreader member 130 that interfaces with first and second board receiving members 58 and 60. As will be detailed more fully below, heat spreader member 130 in addition to providing a heat transfer interface, also provides an electrical interface that facilitates electrical transmissions between electronics board 120 and main carrier board 124.

Figure 5:
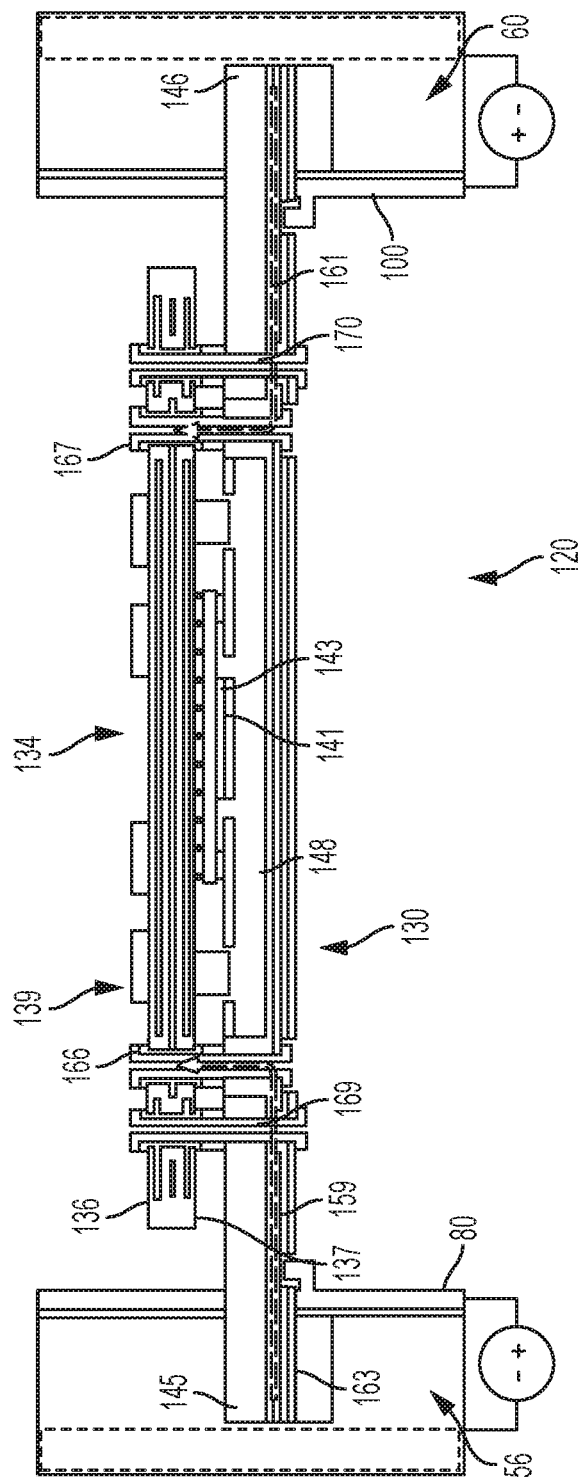
FIG. 5 depicts a partial cross-sectional top view of the electronics board of FIG. 4.

In the exemplary embodiment illustrated in FIG. 5, heat spreader member 130 supports an electronics board 134 having a first side section 136 and a second side section 137. First side section 136 supports a first plurality of chips, one of which is indicated at 139 and second side section 137 supports a second plurality of chips, one of which is indicated at 141. Chip 141 is arranged in a heat exchange relationship with heat spreader member 130. More specifically, chip 141 may thermally connected with heat spreader member 130 through a thermal interface material (TIM) 143.

In accordance with an aspect of an exemplary embodiment, heat spreader member 130 includes a first end portion 145, a second end portion 146 and an intermediate portion 148 extending therebetween. First end portion 145 may be received in one of the plurality of board receiving slots 78 of first board receiving member 58 and second end portion 146 may be received on one of the plurality of board receiving slots 98 of second board receiving member 60.

When installed in one of the plurality of board receiving slots 78, first end portion 145 is in thermal communication with cooling fluid circuit 86 in first board receiving member 58. Similarly, when installed in one of the plurality of board receiving slots 98, second end portion 146 is in thermal communication with the cooling fluid circuit (not shown) in second board receiving member 60. In this manner, fluid flowing through first and second fluid conduits 20 and 22 may exchange heat with heat spreader member 130 in order to reduce temperatures on chips 139 and chips 141.

In addition to providing thermal communication with first and second fluid conduits 20 and 22, heat spreader member 130 also establishes an electrical flow path between electronic board 134 and power supply assembly 24. More specifically, heat spreader member 130 includes a first conductor 159 that may be electrically connected to power supply 24 through first board receiving member 58 and a second conductor 161 that may be electrically connected to power supply 24 through second board receiving member 60. In addition, heat spreader member 130 includes a ground 163 that connects to ground through one, the other, or both first and second board receiving members 58 and 60.

In still further accordance with an exemplary embodiment, electronics board 134 includes a first connector 166, a second connector 167, a third connector 169 and a fourth connector 170. First and second connectors 166 and 167 provide an electrical interface with first and second conductors 159 and 161 respectively. Third and fourth connectors 169 and 170 provide an electrical communication to ground 163. With this arrangement, chips 139 and 141 may receive electrical energy from power supply 24.

Figure 6:
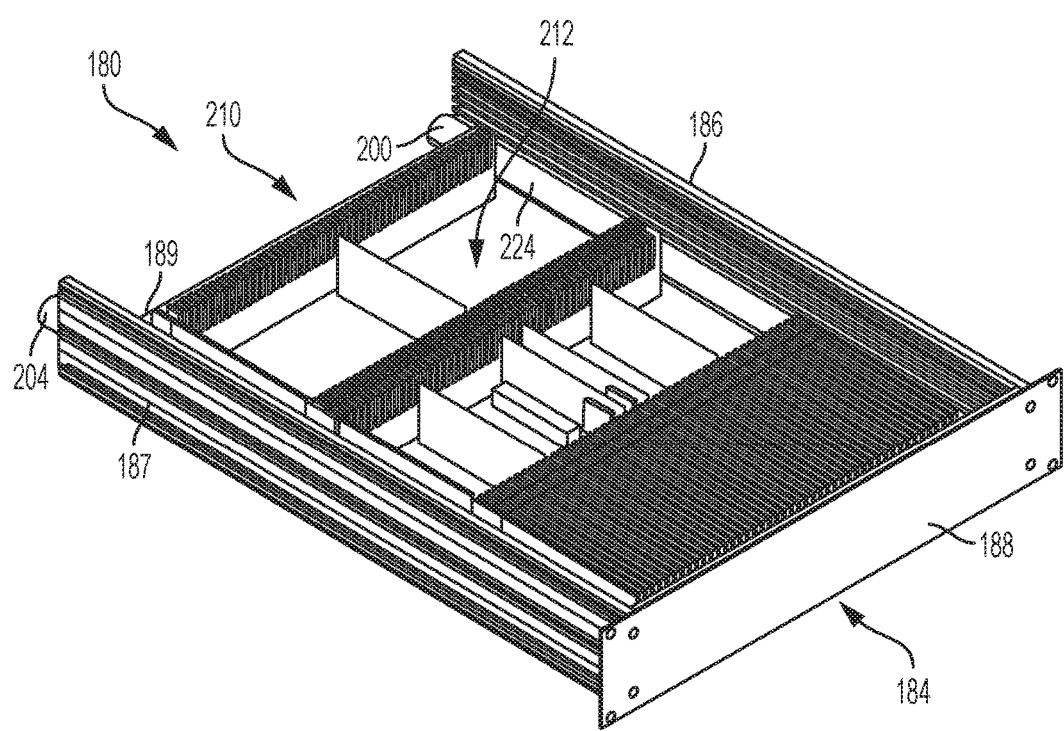
FIG. 6 depicts a cooling and power delivery system, in accordance with another aspect of an exemplary embodiment.

FIG. 6 depicts a cooling and power delivery system 180 in accordance with another aspect of an exemplary embodiment. Cooling and power delivery system 180 may be built into a server drawer 184 having first and second opposing sides 186 and 187 joined by a forward side 188 and a rear edge 189. In the exemplary embodiment shown, a first fluid conduit 200 extends along first side 186 between forward side 188 and rear edge 189 and a second fluid conduit 204 extends along second side 187 between forward side 188 and rear edge 189.

In the exemplary aspect shown, first fluid conduit 200 may form a fluid inlet (not separately labeled) and second fluid conduit 204 may form a fluid outlet (also not separately labeled). Thus, first and second fluid conduits may be fluidically connected within server drawer 184. As further shown in FIG. 6, a first board receiving member 210 extends between first and second fluid conduits 200 and 204. A second board receiving member 212 also extends between first and second fluid conduits 200 and 204. Further, at least one power supply assembly 224 extends along, and in thermal contact with, first fluid conduit 200. A second power supply (not shown) may extend along in thermal contact with second fluid conduit 204.

At this point, it should be understood that the exemplary embodiments provide a system for reducing temperatures of and providing power to electronic boards. Combining cooling and power delivery provides various benefits, particularly for high density installations. High density installations should be understood to include tight spacing of chips on an electronic board, and/or tight packing of electronics boards on, for example, main board as shown in FIG. 4.

Further, exemplary embodiments eliminate the need for dedicated power supply cooling. That is, the exemplary embodiments integrate electronic board cooling with power supply cooling to save space, and reduce components. Further, the use of heat spreader members offers additional current paths in a computer. That is, integrating the power supply and board receiving members reduces conductor runs in the main carrier board which may carry main power delivery voltage.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A cooling and power delivery system for a computer system comprising:
    a first fluid conduit;
    a second fluid conduit;
    a power supply thermally connected to at least one of the first and second fluid conduits;
    a first board receiving member including a first fluid inlet directly fluidically connected to the first fluid conduit and a first fluid outlet directly fluidically connected to the second fluid conduit, the first board receiving member being electrically connected to the power supply, the first board receiving member including a first plurality of board receiving slots;
    a second board receiving member including a second fluid inlet directly fluidically connected to the first fluid conduit and a second fluid outlet directly fluidically connected to the and second fluid conduit, the second board receiving member being electrically connected to the power supply, the second board receiving member including a second plurality of board receiving slots; and
    an electronics board supported between one of the first plurality of board receiving slots and one of the second plurality of board receiving slots, the electronics board being electrically connected to the power supply through at least one of the first and second board receiving members.

2. The cooling and power delivery system according to claim 1, wherein the electronics board includes a heat spreader member including a first end portion thermally connected to the first fluid conduit through the first board receiving member and a second end portion thermally connected to the second fluid conduit through the second board receiving member.

3. The cooling and power delivery system according to claim 2, wherein the electronics board is electrically connected to power supply through the heat spreader member.

4. The cooling and power delivery system according to claim 2, wherein the head spreader member includes a first conductor extending between the first and second end portions and a second conductor extending between the first and second end portions, wherein each of the first and second conductors is electrically connected to the power supply through at least one of the first and second board receiving members.

5. The cooling and power delivery system according to claim 4, wherein each of the first and second conductors are electrically connected to the power supply through the first and second board receiving members.

6. The cooling and power delivery system according to claim 2, wherein the electronics board includes at least one chip thermally connected with the heat spreader member.

7. The cooling and power delivery system according to claim 1, wherein the power supply is arranged between and in a thermally conductive relationship with, the first and second fluid conduits.

8. The cooling and power delivery system according to claim 7, wherein the first board receiving member includes a first end, a first side and an opposing second side extending therebetween, the first plurality of board receiving member extending along one of the first and second opposing sides.

9. The cooling and power delivery system according to claim 8, wherein the first fluid inlet is arranged on the first side and the first fluid outlet is arranged on the first side spaced from the first fluid inlet.

10. The cooling and power delivery system according to claim 1, wherein the first and second fluid conduits conduct a liquid in a heat exchange relationship with the electronics board.

11. A method of cooling and delivering power to a computer system comprising:
    guiding a fluid into a first fluid conduit;
    passing heat from a power supply thermally connected to the fluid conduit into the fluid;
    delivering the fluid into a first fluid inlet directly fluidically connecting a first board receiving member and the first fluid conduit;
    guiding the fluid into a second fluid inlet directly fluidically connecting a second board receiving member and the first fluid conduit;
    delivering power to an electronic card from the power supply through at least one of the first and second board receiving members;

guiding the fluid from a first fluid outlet directly fluidically connecting the first board receiving member and a second fluid conduit; and passing the fluid from a second fluid outlet directly fluidically connecting the second board receiving member and the second fluid conduit.

12. The method of claim 11, further comprising: exchanging heat between the fluid and an electronic card supported between the first board receiving member and the second board receiving member.

13. The method of claim 12, wherein delivering power to the electronic card includes passing electrical power from the power supply, through the one of the first and second board members, into a conductor provided in a heat spreader member supporting the electronic card.

14. The method of claim 13, passing electrical power from the power supply, through the one of the first and second board members includes passing electrical power through both of the first and second board receiving members and the heat spreader member.

15. The method of claim 12, further comprising: passing heat from the power supply into the fluid passing to the second fluid conduit, the power supply being arranged between and in thermal communication with, each of the first fluid conduit and the second fluid conduit.

16. The method of claim 11, wherein delivering the fluid into the first board receiving member includes introducing the fluid into a first end of the first board receiving member and passing the fluid from the first board receiving member includes guiding the fluid from the first end of the first board receiving member.

17. The method of claim 13, wherein exchanging heat between the fluid and an electronic card includes passing the fluid in a heat exchange relationship with an end portion of the heat spreader member.

18. The method of claim 17, wherein exchanging heat between the fluid and the electronics card includes passing heat from a chip on the electronics card into the heat spreader member.

19. The method of claim 11, wherein guiding the fluid into the first fluid conduit includes passing a liquid into the fluid conduit.

* * * * *